United States Patent [19]
Smith et al.

[11] 3,989,965
[45] Nov. 2, 1976

[54] ACOUSTIC TRANSDUCER WITH DAMPING MEANS

[75] Inventors: Richard W. Smith; Gerald E. Adamson, both of Richland, Wash.

[73] Assignee: Westinghouse Electric Corporation, Pittsburgh, Pa.

[22] Filed: July 27, 1973

[21] Appl. No.: 383,202

[52] U.S. Cl. ............................... 310/8.2; 340/8 FT; 310/9.2; 310/9.7; 310/8.7

[51] Int. Cl.[2] ........................................ H01L 41/08

[58] Field of Search ............... 310/8.2, 8.3, 9.1, 9.4, 310/9.2, 8.7, 9.7; 340/8 MM, 8 FT

[56] References Cited

UNITED STATES PATENTS

| | | | |
|---|---|---|---|
| 1,588,176 | 6/1926 | Ellis | 310/8.2 X |
| 2,728,869 | 12/1955 | Pohlman | 310/8.7 |
| 2,803,129 | 8/1957 | Bradfield | 310/9.7 X |
| 3,299,301 | 1/1967 | Heilmann et al. | 310/9.7 X |
| 3,376,438 | 4/1968 | Colbert | 310/8.2 |
| 3,409,869 | 11/1968 | McCool | 340/8 FT |
| 3,586,889 | 6/1971 | Kolter | 310/9.2 |
| 3,794,866 | 2/1974 | McElroy et al. | 310/8.2 |

FOREIGN PATENTS OR APPLICATIONS

| | | | |
|---|---|---|---|
| 1,086,640 | 10/1967 | United Kingdom | 310/8.2 |

*Primary Examiner*—Mark O. Budd
*Attorney, Agent, or Firm*—D. C. Abeles

[57] ABSTRACT

An ultrasonic transducer specifically suited to high temperature sodium applications is described. A piezoelectric active element is joined to the transducer faceplate by coating the faceplate and juxtaposed active element face with wetting agents specifically compatible with the bonding procedure employed to achieve the joint. The opposite face of the active element is fitted with a backing member designed to assure continued electrical continuity during adverse operating conditions which can result in the fracturing of the active element. The fit is achieved employing a spring-loaded electrode operably arranged to electrically couple the internal transducer components, enclosed in a hermetically sealed housing, to accessory components normally employed in transducer applications.

Two alternative backing members are taught for assuring electrical continuity. The first employs a resilient, discrete multipoint contact electrode in electrical communication with the active element face. The second employs a resilient, elastomeric, electrically conductive, damped member in electrical communication with the active element face in a manner to effect ring-down of the transducer. Each embodiment provides continued electrical continuity within the transducer in the event the active element fractures, while the second provides the added benefit of damping.

1 Claim, 5 Drawing Figures

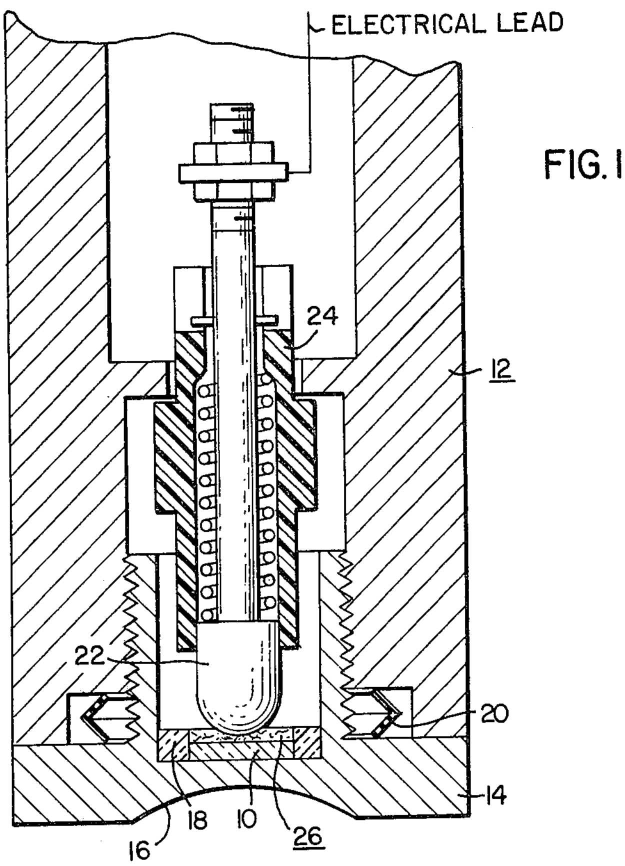
FIG. 1
FIG. 2
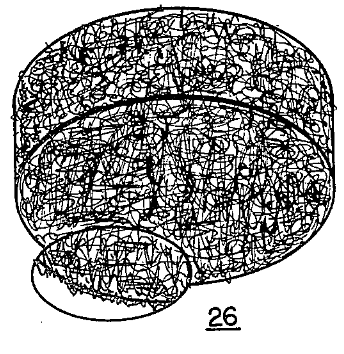
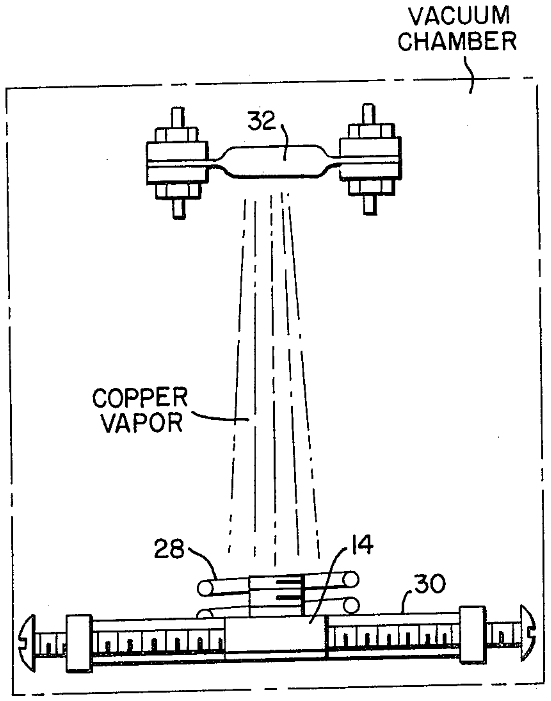
FIG. 3

ACOUSTIC TRANSDUCER WITH DAMPING MEANS

BACKGROUND OF THE INVENTION

The invention described herein was made in the course of, or under, a contract with the U.S. Atomic Energy Commission and pertains generally to acoustical transducers and their methods of fabrication, and more specifically to such transducers designed for high temperature applications.

The advent of the liquid metal fast breeder reactor engendered the advance of the state of the art of sodium technology and compatible monitoring instrumentation. The application of ultrasonics to in-sodium monitoring appears to be the most suitable approach to such monitoring systems. However, conventional ultrasonic transducers are not functionally operative in high temperature liquid sodium environments. The materials presently employed are subject to damage from the radiation, corrosive environment and high temperature ranges encountered. For example, the active element is subject to cracking, which impairs or destroys the signal continuity, and thus, the effectiveness of the transducer.

Accordingly, an acoustical transducer is desired, capable of withstanding the high temperature, high radiation levels and caustic environment of fast breeder reactors so as to effect a reliable in-sodium monitoring system.

SUMMARY OF THE INVENTION

Briefly, this invention provides an acoustic transducer specifically suited to high temperature applications. A novel method insures continued maximum acoustic coupling at the active element/transducer faceplate interface. The interface is joined by coating the faceplate and juxtaposed active element face with corresponding wetting agents specifically compatible with the bonding alloy employed to achieve the joint in an inert atmosphere. A novel, electrically conductive backing member, having the desired characteristics of assuring continued electrical continuity in the event of a fractured active element, is supported against the opposite face of the element. The entire unit is enclosed in a housing with external electrical contacts supplied for coupling accessory components.

Two alternative backing members are taught for corresponding alternate applications. The first employs a resilient, multipoint contact electrode in electrical communication with the active element at a plurality of discrete points over the surface area of one face of the element. The second employs a resilient, elastomeric, electrically conductive, damped member in electrical communication with the active element face in a manner to effect ring-down of the transducer. Each embodiment provides continued electrical continuity in the event of a cracked active element, while the second provides the added benefit of damping where desired.

BRIEF DESCRIPTION OF THE DRAWINGS

For better understanding of the invention, reference may be had to the preferred embodiment, exemplary of the invention, shown in the accompanying drawings, in which:

FIG. 1 is a cross sectional view of an acoustic transducer employing the novel features of this invention;

FIG. 2 is an isometric view of a novel backing member which can be employed in the transducer of FIG. 1;

FIG. 3 is a perspective view of a vapor deposition assembly employed in the fabrication of the transducer of FIG. 1;

Like reference characters referred to in the following description refer to corresponding elements characterized in the several views.

DESCRIPTION OF THE PREFERRED EMBODIMENT

Figure 4A:
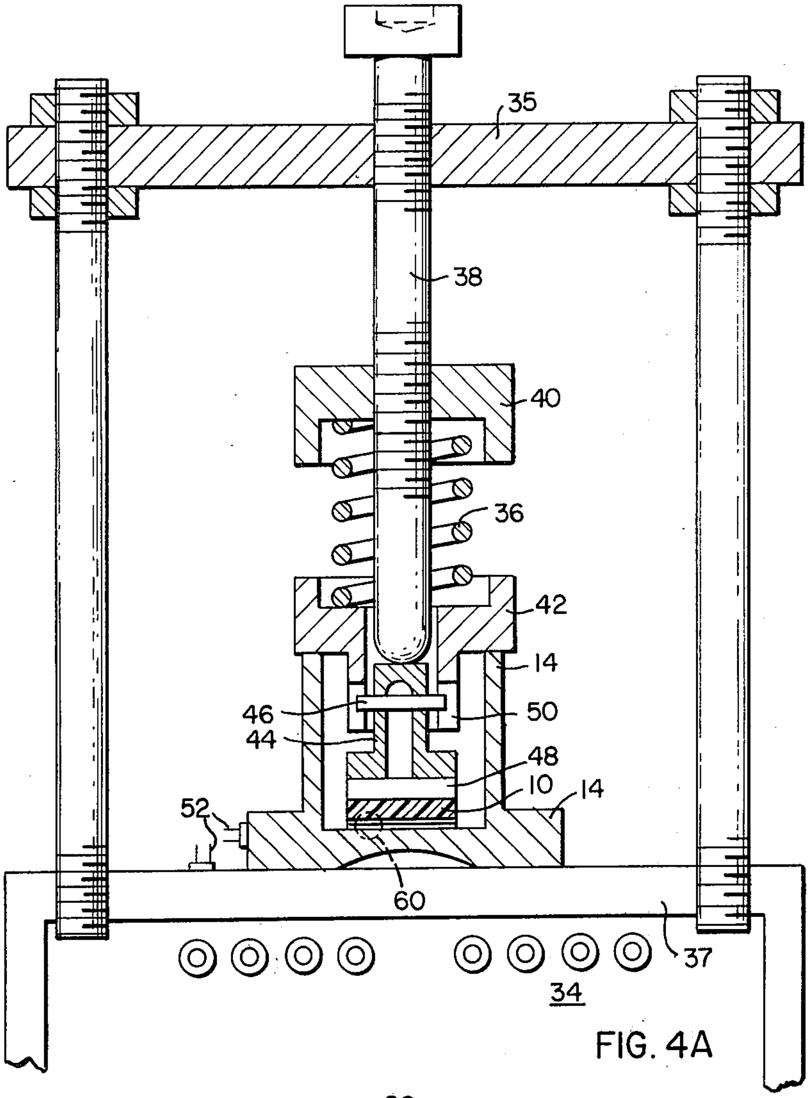
FIG. 4A is a perspective view of the bonding assembly employed to affix the active element to the faceplate of the transducer of FIG. 1.

The transducer of this invention is specifically suitable for high temperature applications in a reactive, caustic, sodium environment and includes as its basic element a piezoelectric active element encased in a housing 12 constructed of a material specifically compatible with sodium such as stainless steel. FIG. 1 shows the basic configuration. The active element 10, typically lead zirconate, lead titanate ceramic, is bonded to the backside of the transducer faceplate 14 coaxial with the transducer lens 16 formed as a concave cutaway portion in the lower side of the transducer faceplate. Electrical isolation is maintained between the side walls of the housing 12 and the piezoelectric active element 10 by a fitted ceramic annular washer 18 interposed between the housing side walls and the element. Copper clad "V" seals prevent entry of liquid sodium, though it should be understood that other hermetic seals can be employed such as swage lock fittings. A spring loaded electrical contactor 22 makes electrical contact with the back electrode of the crystal 10, and a polyimide or other high temperature, radiation resistant insulator 24 isolates the contactor from the housing. The spherical-shaped concave lens 16 machined into the transducer faceplate focuses the ultrasound at a point F determined by:

$$F = (R(n/(n-1))),$$

where R is the radius of curvature of the surface, and $n$ the index of refraction for sound between the lens material and sodium.

This invention provides a novel backing member 26 interposed between the back side of the active element 10 and the electrode 22, which is specifically advantageous when employed in conjunction with thin active elements to maintain electrical continuity between the electrode 22 and the active element. One novel embodiment of the backing member, illustrated in FIG. 2, is formed, from a loosely woven, resilient pellet of wire, which establishes electrical contact over the surface area of the back side of the active element at a multitude of discrete points. In its preferred form, the point contacts are closely spaced and the wire is interwoven in an irregular pattern so that electrical continuity is maintained at substantially all portions of the back area of the active element in the event fracturing of the active element is encountered during operation. Accordingly, even under such adverse conditions, all portions of the transducer will remain active to assure the sensitivity and reliability of the output. The pressure excited by the electrical contactor 22 and the resiliency of the backing member 26 assures that this continuity is maintained at all times.

While various backing members have been taught by the prior art, especially wire mesh configurations as exemplified by the patents to R. L. Cook et al, U.S. Pat. No. 3,496,617, and P. E. Heilmann et al, U.S. Pat. No. 3,299,301, the present state of the art does not appear to teach the pressure loaded contactor 26 described which contacts the active element electrode at many randomly spaced points over the entire crystal area. While the backing member contacts the active element at a plurality of points, damping is minimal, owing to the small area of each contact. If the crystal of the active element cracks, contact is assured to the whole crystal due to the random configuration, and the resiliency of the contacting points.

An alternate configuration to the backing member of FIG. 2, as shown in FIG. 1 generally described by reference character 26, can be employed where damping is desired. The method of this invention for fabricating such a damping member which additionally maintains the electrical continuity described, involves pouring a room temperature vulcanizing (RTV) silicon rubber such as RTV-116, heavily laden with tungsten powder exemplarily in the order of 200 mesh, onto the back of the active element. The result is an electrically conductive backing member which establishes contact at all portions of the active element, blocking member interface in addition to damping the transducer. To obtain the high tungsten to RTV ratio, the RTV is diluted with a compatible solvent such as toluene, to a low viscosity. Applying this method, tungsten to RTV ratios as high as 20 to 1 by weight have been obtained and higher ratios can be expected.

Transducers of the prior art have used elastomer materials such as silicon rubber for varying applications as exemplarily illustrated by the patents to Kolter, U.S. Pat. No. 3,586,889, Lungo, U.S. Pat. No. 3,560,772 and Miller U.S. Pat. No. 3,663,842. In contrast, the elastomer backing member of this invention, loaded with tungsten powder, provides a damped piezoelectric element without limiting its frequency range of response. The tungsten particles, having a very high acoustic impedance, effectively act as scattering centers to disperse the sound. In addition the tungsten raises the acoustic impedance of the backing member so that a larger portion of the signal is transmitted through the backing member. Since the backing member is made with high temperature silicon rubber the finished transducer can be used at high temperatures of approximately 500° F. The high ratio of tungsten to silicon rubber as taught by this invention, renders the backing member electrically conductive with the desired properties described and the elastomeric qualities of the member in its diluted state, maintains continuity of electrical contact over the entire face of the crystal (active element) in the event of fracturing of the active element.

Thus, the contributions of this invention in providing continued electrical continuity, a broad frequency range of responses, operability in a high temperature caustic environment, and damping, fill the void in the teachings of the prior art engendered by the advent of fast breeder technology.

An important consideration in the fabrication of such transducers for use in high temperature caustic sodium environments is the bond fastening of the active element to the transducer faceplate which protects the active element from the sodium and focuses the ultrasound. One particular bonding material specifically suitable for such an application is lead alloy solder (1.5% Ag/5% Sn/93.5% Pb) which has a melting point of approximately 560° F. This bond must withstand the temperature and radiation levels projected for fast breeder applications and must provide proper acoustic coupling between the active element and the lens. Further, the bond must have adequate ductility to accommodate the large difference in thermal expansion, in the order of 6:1 between the active element and the lens. To assist wetting of the transducer faceplate/-sodium interface, which is essential for good acoustic coupling, the faceplate is etched to remove oxidation and foreign matter and a one micron thick layer of gold is vapor deposited onto the lens outer surfaces 16 to passivate the surface and prevent reoxidation and contamination. In sodium, the gold rapidly dissolves away, thereby exposing the clean transducer face to the sodium. Therefore, the bonding operation must be done in an inert or oxygen free environment to prevent reoxidation of the transducer face, thus, soldering flux cannot be used.

Preparation of the active element involves removal of the normally supplied fired on silver electrodes which would otherwise dissolve in solder. A two micron thick copper electrode is then sputtered on the side of the crystal to be bonded to the transducer faceplate and a two micron thick platinum electrode is sputtered on the opposite side of the crystal. This procedure results in well bonded electrodes with the added advantage that the solder bonding alloy readily wets the copper, and the platinum electrode is not subject to oxidation. It sometimes becomes necessary to repolarize the ceramic elements after the sputtering operation is complete.

The back surface of the stainless steel lens to be bonded must be prepared to induce the bonding alloy to wet the faceplate. Deposition of a copper bonding layer on the back side of the faceplate precedes the bonding of the active element for this purpose. A fixture specifically suited for accomplishing the vapor deposition of copper on the faceplate is shown in FIG. 3. The transducer plate 14 is secured in position by aluminum oxide insulators 30 and the faceplate is heated in this embodiment to a desired temperature of approximately 950° C by the induction heater coil 28. Vaporization of the copper is achieved by the resistance heated evaporation source 32 and the entire assembly is maintained in a vacuum environment to prevent reoxidation of the transducer faceplate. Vapor deposition of the copper coating starts with the transducer faceplate at an approximate temperature of 950° C and continues as the plate cools. This treatment diffuses part of the copper into the faceplate and results in a well bonded copper layer readily wet by the bonding alloy. The result provides an approximately one micron thick layer of copper integrally bonded to the faceplate surface.

Figure 4B:
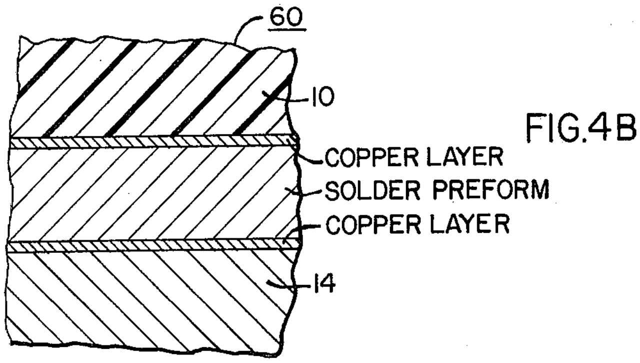
FIG. 4B is a magnified view of a section of the active element-faceplate bonding interface illustrated in FIG. 4A.

FIG. 4A shows the apparatus empolyed to bond the active element 10 to the faceplate 14. This operation takes place in a vacuum or inert gas chamber to avoid contamination or oxidation of the faceplate. Good mechanical contact between the several parts must be achieved to insure good thermal conductivity. Therefore, a spring 36 is provided to exert sufficient force to clamp the faceplate against the lower support plate 37, and a screw 38 is supplied to clamp the active element onto the faceplate 14. The spring 36 is would coaxially around the clamping screw 38 and is supported in position and maintained in compression by upper and lower retaining forms 40 and 42 with the lower form 42 pressed securely against the male fitting of the transducer faceplate. The upper form is supported on the clamping screw 38 by mating threads formed integral with the upper form and clamping screw respectively. The threaded connection is shown adjustable in a manner to effect the degree of compression of the spring desired. The clamping screw 38 extends longitudinally downward from an upper support plate 35, through an annular opening in the lower form 42 and abuts against an anvil 44 secured against rotation by a radially positioned pin 46 which is fitted within the keyways 50 formed in the walls of the annular opening of the lower form 42. The anvil 44 presses against a quartz disc which distributes the pressure applied by the clamping screw 38 over the entire back face of the active element. A solder preform of the bonding alloy is interposed between the lower face of the active element and the transducer faceplate as shown in the magnified section 60 illustrated in FIG. 4B. Fine adjustment of the pressure exerted by the quartz disc 48 on the active element is achieved by rotation of the clamping screw 38. Thermocouples are respectively positioned on the faceplate and the inductively heated hotplate 34 to assure the desired temperatures are achieved.

Heating the bonding assembly to approximately 610° F over a period of about 15 minutes melts the bonding alloy; and at this point, release of pressure holding the element onto the faceplate allows the active element to float on the molten bonding alloy. This condition is achieved automatically as the solder preform melts and lowers the quartz/anvil assembly from contact with the spring clamp. Slow cooling of the faceplate precedes removal from the bonding chamber.

Experimental results verified the effectiveness of the method and apparatus described in achieving an effective bonded joint as well as maintaining integral electrical continuity during adverse operating conditions.

Accordingly, an acoustic transducer is provided compatible with high temperature caustic sodium environments which makes feasible the application of ultrasonic technology to fast breeder reactor instrumentation.

We claim as our invention:

1. An acoustic transducer having improved damping characteristics comprising:

an enclosed housing having a portion of one wall constructed of acoustically conductive material effectively forming an acoustic window;

a piezoelectric element having a first and second surface of corresponding opposite polarities positioned within said housing, the first of said surfaces, being in acoustic communication with the acoustic window;

a resilient, elastomeric, electrically conductive, acoustically damped backing member in electrical communication with said second surface of said piezoelectric element making electrical contact substantially over the entire continuous surface area thereof in a manner to promote electrical communication with the surface area of said second surface in the event of cracking and effect ring-down of the transducer, said backing member being formed from room temperature vulcanizing silicon rubber impregnated with tungsten, wherein the tungsten to room temperature vulcanizing rubber ratio is at least six to one by weight; and means for electrically coupling said backing member to the exterior of said housing.

* * * * *